(12) United States Patent
Zhou et al.

(10) Patent No.: US 9,373,407 B2
(45) Date of Patent: Jun. 21, 2016

(54) NON-VOLATILE MEMORY DEVICE WITH CURRENT INJECTION SENSING AMPLIFIER

(71) Applicant: Silicon Storage Technology, Inc., San Jose, CA (US)

(72) Inventors: Yao Zhou, Shanghai (CN); Xiaozhou Qian, Shanghai (CN); Ning Bai, Shanghai (CN)

(73) Assignee: Silicon Storage Technology, Inc., San Jose, CA (US)

( * ) Notice: Subject to any disclaimer, the term of this patent is extended or adjusted under 35 U.S.C. 154(b) by 0 days.

(21) Appl. No.: 14/386,816

(22) PCT Filed: Mar. 15, 2013

(86) PCT No.: PCT/US2013/032543
§ 371 (c)(1),
(2) Date: Sep. 22, 2014

(87) PCT Pub. No.: WO2013/148363
PCT Pub. Date: Oct. 3, 2013

(65) Prior Publication Data
US 2015/0078082 A1    Mar. 19, 2015

(30) Foreign Application Priority Data

Mar. 30, 2012  (CN) .......................... 2012 1 0089957

(51) Int. Cl.
| G11C 16/28 | (2006.01) |
| G11C 16/26 | (2006.01) |
| G11C 11/56 | (2006.01) |
| G11C 16/08 | (2006.01) |
| G11C 7/06  | (2006.01) |

(52) U.S. Cl.
CPC ................ *G11C 16/26* (2013.01); *G11C 7/062* (2013.01); *G11C 11/5642* (2013.01); *G11C 16/08* (2013.01); *G11C 16/28* (2013.01); *G11C 2207/063* (2013.01)

(58) Field of Classification Search
CPC ....................................................... G11C 16/28
USPC ..................................................... 365/185.21
See application file for complete search history.

(56) References Cited

U.S. PATENT DOCUMENTS

| 6,075,738 A  * | 6/2000 | Takano .............. G11C 11/5621 365/185.26 |
| 6,233,189 B1   | 5/2001 | Tanzawa |
| 6,400,607 B1 * | 6/2002 | Pasotti ................... G11C 16/28 365/185.2 |

(Continued)

FOREIGN PATENT DOCUMENTS

| CN | 1455412 A | 11/2003 |
| CN | 1848299 A | 10/2006 |

(Continued)

OTHER PUBLICATIONS

Chinese Office Action dated Jul. 30, 2015 corresponding to the related Chinese Patent Application No. 201210089957.9. (English).

(Continued)

*Primary Examiner* — Son Mai
(74) *Attorney, Agent, or Firm* — DLA Piper LLP (US)

(57) ABSTRACT

A non-volatile memory device with a current injection sensing amplifier is disclosed.

26 Claims, 8 Drawing Sheets

(56) References Cited

U.S. PATENT DOCUMENTS

| | | | |
|---|---|---|---|
| 6,535,428 B2* | 3/2003 | Pasotti | G11C 7/062 |
| | | | 365/185.2 |
| 6,687,162 B1 | 2/2004 | Hsueh et al. | |
| 6,788,581 B2 | 9/2004 | Mihara et al. | |
| 6,788,601 B2 | 9/2004 | Takano et al. | |
| 6,801,457 B2* | 10/2004 | Tanzawa | G11C 11/5628 |
| | | | 365/185.03 |
| 7,075,844 B2* | 7/2006 | Pagliato | G11C 16/28 |
| | | | 365/189.09 |
| 7,136,305 B2* | 11/2006 | Pagliato | G11C 7/062 |
| | | | 365/185.2 |
| 7,142,464 B2* | 11/2006 | Dadashev | G11C 11/5642 |
| | | | 365/189.09 |
| 7,251,178 B2* | 7/2007 | Gogl | G11C 7/02 |
| | | | 327/53 |
| 7,486,546 B2* | 2/2009 | Wang | G11C 7/062 |
| | | | 365/158 |
| 7,656,710 B1 | 2/2010 | Wong | |
| 2004/0008540 A1 | 1/2004 | Mihara et al. | |
| 2004/0047184 A1 | 3/2004 | Tran et al. | |
| 2004/0062116 A1 | 4/2004 | Takano et al. | |
| 2004/0160837 A1 | 8/2004 | De Santis et al. | |
| 2008/0186790 A1 | 8/2008 | Pyeon et al. | |
| 2010/0254207 A1 | 10/2010 | Liu et al. | |
| 2011/0090743 A1* | 4/2011 | Tran | G11C 16/28 |
| | | | 365/185.23 |

FOREIGN PATENT DOCUMENTS

| | | |
|---|---|---|
| CN | 1937081 A | 3/2007 |
| CN | 101221807 A | 7/2008 |
| JP | 7-221203 | 8/1995 |
| JP | 10-302486 | 11/1998 |
| JP | 2000-353394 | 12/2000 |

OTHER PUBLICATIONS

Taiwanese Office Action dated Aug. 3, 2015 corresponding to the related Taiwanese Patent Application No. 102110065. (TW Search Report in English).

Japanese Office Action dated Sep. 24, 2015 corresponding to the related Japanese Patent Application No. 2015-503345. (Japanese Translations only).

* cited by examiner

NON-VOLATILE MEMORY DEVICE WITH CURRENT INJECTION SENSING AMPLIFIER

TECHNICAL FIELD

A non-volatile memory cell with a current injection sensing amplifier is disclosed.

BACKGROUND OF THE INVENTION

Non-volatile semiconductor memory cells using a floating gate to store charges thereon and memory arrays of such non-volatile memory cells formed in a semiconductor substrate are well known in the art. Typically, such floating gate memory cells have been of the split gate type, or stacked gate type.

Read operations usually are performed on floating gate memory cells using sensing amplifiers. A sensing amplifier for this purpose is disclosed in U.S. Pat. No. 5,386,158 (the "'158 Patent"), which is incorporated herein by reference for all purposes. The '158 Patent discloses using a reference cell that draws a known amount of current. The '158 Patent relies upon a current mirror to mirror the current drawn by the reference cell, and another current mirror to mirror the current drawn by the selected memory cell. The current in each current mirror is then compared, and the value stored in the memory cell (e.g., 0 or 1) can be determined based on which current is greater.

Another sensing amplifier is disclosed in U.S. Pat. No. 5,910,914 (the "'914 Patent"), which is incorporated herein by reference for all purposes. The '914 Patent discloses a sensing circuit for a multi-level floating gate memory cell or MLC, which can store more than one bit of data. It discloses the use of multiple reference cells that are utilized to determine the value stored in the memory cell (e.g., 00, 01, 10, or 11). Current mirrors are utilized in this approach as well.

The current mirrors of the prior art utilize PMOS transistors. One characteristic of PMOS transistors is that a PMOS transistor can only be turned "on" if the voltage applied to the gate is less than the voltage threshold of the device, typically referred to as $V_{TH}$. One drawback of using current mirrors that utilize PMOS transistors is that the PMOS transistor causes a $V_{TH}$ drop. This hinders the ability of designers to create sensing amplifiers that operate at lower voltages and consume less power.

What is needed is an improved sensing circuit that operates at a lower voltage supply level and consumes less power than in the prior art.

SUMMARY OF THE INVENTION

The aforementioned problems and needs are addressed by providing sensing circuit that utilizes a current injector and not a current mirror. In one embodiment, a current injector is used to provide a consistent current source that does not change based on load attached to the current injector. The current source in this embodiment comprises four output lines. Three lines each connect to a reference cell and to a comparator. The fourth line connects to the selected memory cell and the comparator. Each reference cell draws a predetermined amount of current. The comparator then compares the remaining current on each of the three lines against the remaining current on the line attached to the selected memory cell. Based on this comparison, outputs are generated that are indicative of the state of the memory cell (e.g., 00, 01, 10, 11) and that are directly related to the relative size of the current on the line attached to the selected memory cell compared to the other three lines.

Other objects and features of the present invention will become apparent by a review of the specification, claims and appended figures.

DETAILED DESCRIPTION OF THE PREFERRED EMBODIMENTS

Figure 1:
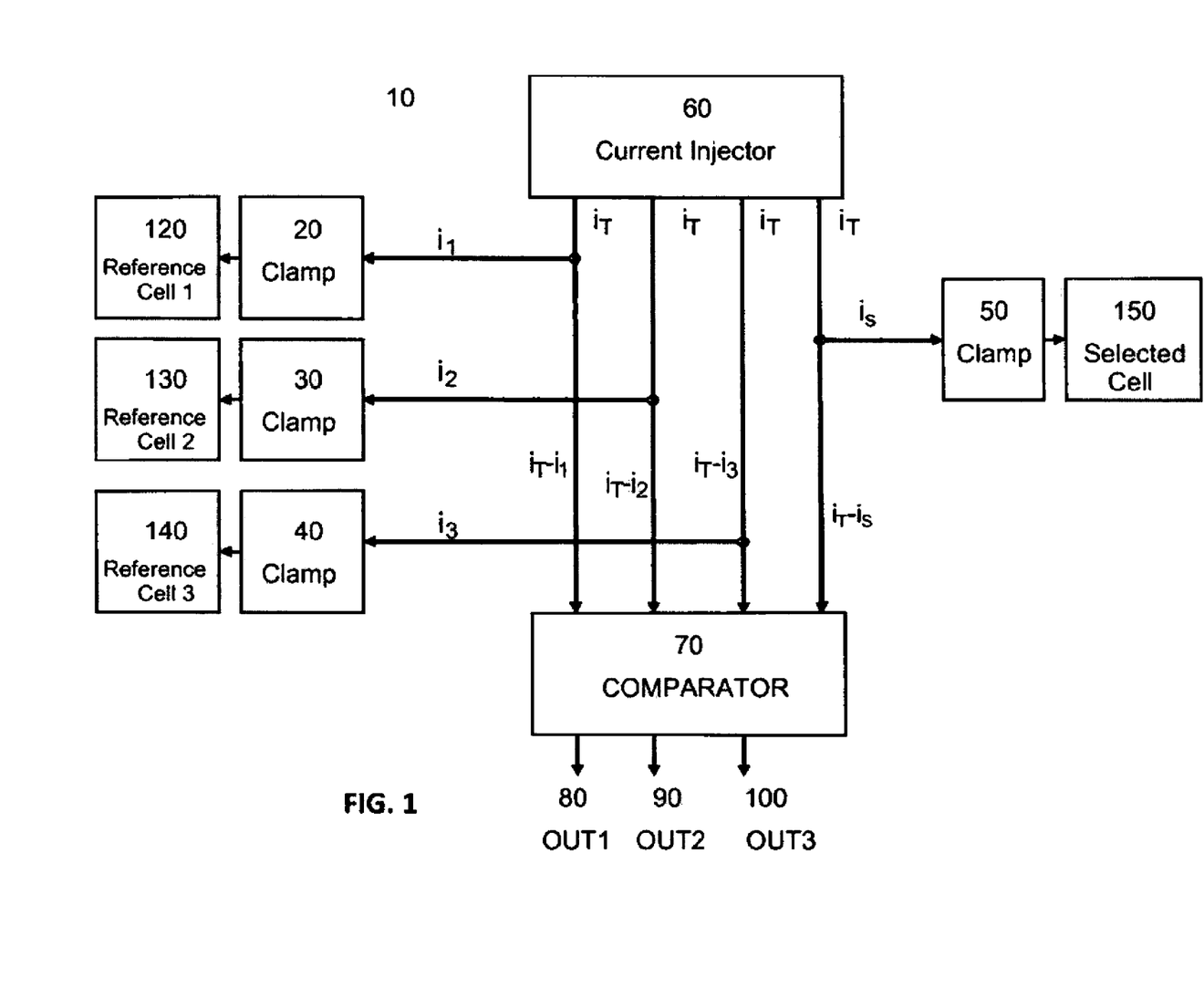
FIG. 1 is an exemplary block diagram of a sensing circuit embodiment that comprises a current injector.

An embodiment will now be described with reference to FIG. 1. A sensing circuit 10 is depicted. Sensing circuit 10 comprises a current injector 60, reference clamp loop 20 coupled to reference cell 120, reference clamp loop 30 coupled to reference cell 130, reference clamp loop 40 coupled to reference cell 140, clamp loop 50 coupled to selected cell 150, and comparator 70. In this embodiment, selected cell 150 can store one of four possible values (for ease of reference, referred to as "00," "01," "10," and "11"), and three reference cells are used, but one of ordinary skill in the art will appreciate that selected cell 150 can be designed to store either a fewer or greater number of possible values and that a fewer or greater number of reference cells can be used.

Current injector 60 provides a constant current on four separate output lines, with one output line connected to reference clamp loop 20, another to reference clamp loop 30, another to reference clamp loop 40, and another to clamp loop 50. In this embodiment, current injector 60 provides the same amount of current, $i_T$, on each of the four lines.

Selected cell 150 comprises one memory cell within an array of memory cells. Selected cell 150 can be selected for a read operation using a row line and column line, as is well-known to those of ordinary skill in the art. An example of the type of cell that can be used as selected cell 150 is explained in U.S. Pat. No. 7,868,375, which is incorporated herein by reference for all purposes.

Reference clamp loop 20, reference clamp loop 30, and reference clamp loop 40 each can be generated instantly with every read cycle. Reference cell 120, reference cell 130, and reference cell 140 each are always in the "on" position.

By design and operation, reference cell 120, reference cell 130, and reference cell 140 each draw different levels of current. In the example shown in FIG. 1, reference cell 120 draws a current of $i_1$, reference cell 130 draws a current of $i_2$, and reference cell 140 draws a current of $i_3$. Because reference cell 120, reference cell 130, and reference cell 140 are each always "on" and because their load does not change over time, the values of $i_1$, $i_2$, and $i_3$, will not change over time. One of ordinary skill in the art will recognize that reference cells 120, 130, and 140 can be designed to draw different levels of current when "on" through the selection of various parameters, such as gate width and length, for the transistors. Reference cells 120, 130, and 140 may even be the same type of non-volatile memory cell as selected cell 150, but storing different amounts of charge.

Selected cell 150 draws an amount of current $i_S$, which reflects the value that is stored in selected cell 150. Thus, $i_S$ will change over time depending on the value that is stored in selected cell 150.

Comparator 70 is connected to each line that emanates from current injector 60. In this embodiment, one line that is received by current injector 60 contains a current of $i_T$-$i_1$, another contains a current of $i_T$-$i_2$, another contains a current of $i_T$-$i_3$, and another contains a current of $i_T$-$i_S$. Comparator 70 will compare $i_T$-$i_S$ against the other three currents. The comparison with current $i_T$-$i_1$ will result in output 80. The comparison with current $i_T$-$i_2$ will result in output 90. The comparison with current $i_T$-$i_3$ will result in output 100. Outputs 80, 90, and 100 will indicate the state of selected cell 150, specifically, what data is stored by selected cell 150.

In this embodiment, selected cell 150 can hold one of four different values, which can be represented in binary form as 00, 01, 10, or 11 (or in base 4 as 0, 1, 2, or 3) Each of those four values corresponds to different levels of current ($i_S$) that will be drawn by selected cell 150. One purpose of using this embodiment is to determine the value stored in selected cell 150 with a high degree of certainty. This level of certainty is achieved by comparing $i_T$-$i_S$ with the values of $i_T$-$i_1$, $i_T$-$i_2$, and $i_T$-$i_3$.

In one example, if $i_T$-$i_S$ is greater than $i_T$-$i_1$, then output 80 will be "0," and if $i_T$-$i_S$ is less than $i_T$-$i_1$, then output 80 will be "1." If $i_T$-$i_S$ is greater than $i_T$-$i_2$, then output 90 will be "0" and if $i_T$-$i_S$ is less than $i_T$-$i_2$, then output 90 will be "1." If $i_T$-$i_S$ is greater than $i_T$-$i_3$, then output 100 will be "0," and if $i_T$-$i_S$ is less than $i_T$-$i_3$, then output 100 will be "1." The values of output 80, output 90, and output 100 can then be decoded to determine the value stored in selected cell 50 with a high degree of certainty. For example, the values of output 80, output 90, and output 100 can correspond to the values of selected cell 50 shown in Table 1:

TABLE 1

| Value of output 80 | Value of output 90 | Value of output 100 | Value of selected cell 50 |
|---|---|---|---|
| 0 | 0 | 0 | 00 |
| 1 | 0 | 0 | 01 |
| 1 | 1 | 0 | 10 |
| 1 | 1 | 1 | 11 |

The values of output 80, output 90, and output 100 will be based on the values of the currents that are input to comparator 70, i.e., $i_T$-$i_S$, $i_T$-$i_1$, $i_T$-$i_2$, and $i_T$-$i_3$. Reference cell 120, reference cell 130, and reference cell 140 are designed such that the currents that are input to comparator 70 are at the appropriate values that will lead to an accurate determination of the value of selected cell 150.

For example, the value of $i_S$ might be 0.0 mA when selected cell 50 stores a "00," 0.33 mA when selected cell 50 stores a "01," 0.66 mA when selected cell stores a "10," and 1.0 mA when selected cell stores an "11." This will mean that if $i_T$ has a value of 1.0 mA, $i_T$-$i_S$ will be 1.0 mA when selected cell 50 stores a "00," 0.67 mA when selected cell 50 stores a "01," 0.34 mA when selected cell 50 stores a "10" and 0.0 mA when selected cell 50 stores a "11." In that example, it might be desirable for $i_1$ to have a value of 0.17 mA, $i_2$ to have a value of 0.5 mA, $i_3$ to have a value of 0.83 mA, and $i_T$ to have a value of 1.0 mA, such that $i_T$-$i_1$ will be 0.83 mA, $i_T$-$i_2$ will be 0.5 mA, and $i_T$-$i_3$ will be 0.17 mA. In this example, it will be seen that the relationships shown in Table 2 will be present:

TABLE 2

| Value of $i_T$-$i_S$ | Greater or less than $i_T$-$i_1$ (i.e., 0.83 mA)? | Greater or less than $i_T$-$i_2$ (i.e., 0.5 mA)? | Greater or less than $i_T$-$i_3$ (i.e., 0.17 mA)? | Outputs 80, 90, and 100 |
|---|---|---|---|---|
| 1.0 mA | > | > | > | 000 |
| 0.67 mA | < | > | > | 100 |
| 0.33 mA | < | < | > | 110 |
| 0.0 mA | < | < | < | 111 |

This example is merely illustrative. One of ordinary skill in the art will readily understand that either a fewer or greater number of reference cells can be used and that selected cell 150 can be designed to store more than a four possible levels. One of ordinary skill in the art also will understand that there are many values for $i_T$, $i_1$, $i_2$, and $i_3$ that can be chosen through the design of current injector 60, reference cell 120, reference cell 130, and reference cell 140 to lead to the desired result of this embodiment.

Figure 2:
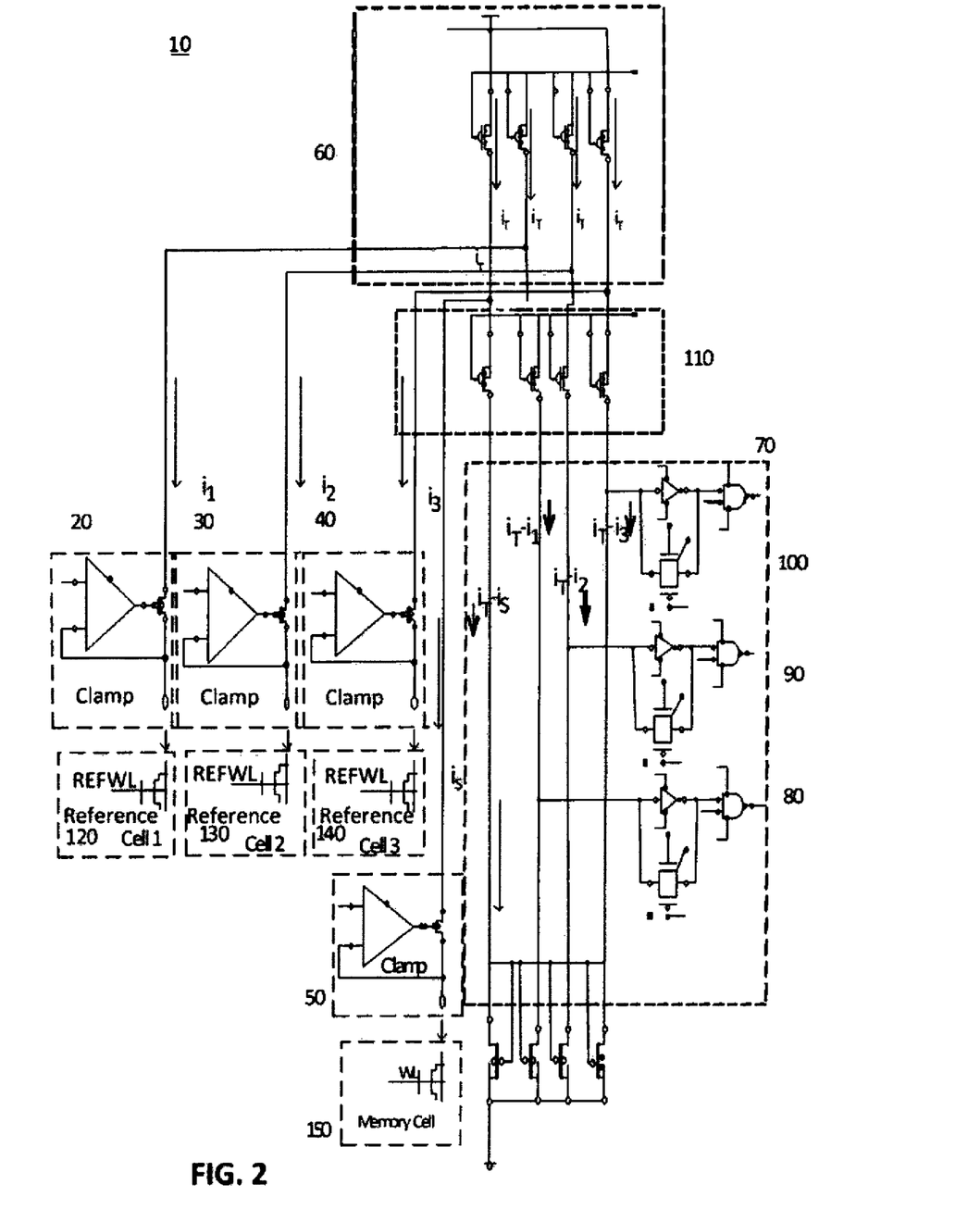
FIG. 2 is an exemplary circuit diagram of a sensing circuit embodiment that comprises a current injector.

Reference is now made to FIG. 2, which shows sensing circuit 10 in greater detail. Shown in FIG. 2 is current injector 60, reference clamp loop 20, reference cell 120, reference clamp loop 30, reference cell 130, reference clamp loop 40, reference cell 140, clamp loop 50, selected cell 150, and comparator 70, as described previously with reference to FIG. 1. FIG. 2 also shows circuit 110, which can be used to generate the drain voltage of each PMOS transistor within current injector 60, where the drain voltage of each PMOS transistor will be the voltage of the gate plus $V_{TH}$ of the PMOS transistor of circuit 110. The drain voltage of each PMOS transistor within current injector 60 should be the same, such that any channel modulation effect can be minimized. Each of these items will be discussed in greater detail with reference to FIGS. 3-5, which each contain an enlarged portion of FIG. 2.

Figure 3:
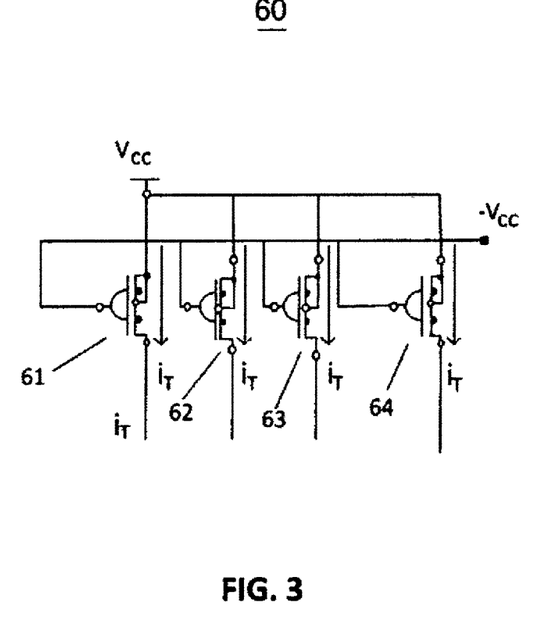
FIG. 3 is an exemplary circuit diagram showing a current injector used in the sensing circuit of FIG. 2.

FIG. 3 depicts current injector 60. Current injector 60 in this example comprises identical PMOS transistors 61, 62, 63, and 64. The sources of PMOS transistors 61, 62, 63, and 64 are tied to supply voltage $V_{CC}$. The gates of PMOS transistors 61, 62, 63, and 64 are tied to a supply voltage that optionally can be generated with every read cycle to turn on the gates. The drains of PMOS transistors 61, 62, 63, and 64 each emit a current of $i_T$. As shown in FIG. 2, the drain of PMOS transistor 61 connects to clamp loop 50 and comparator 70, the drain of PMOS transistor 62 connects to reference clamp loop 20 and comparator 70, the drain of PMOS transistor 63 connects to reference clamp loop 30 and comparator 70, and the drain of PMOS transistor 64 connects to reference clamp loop 40 and comparator 70. As used herein and as is well-known in the art, the term "source" and the term "drain" can be used interchangeably when discussing MOS transistors.

Figure 4:
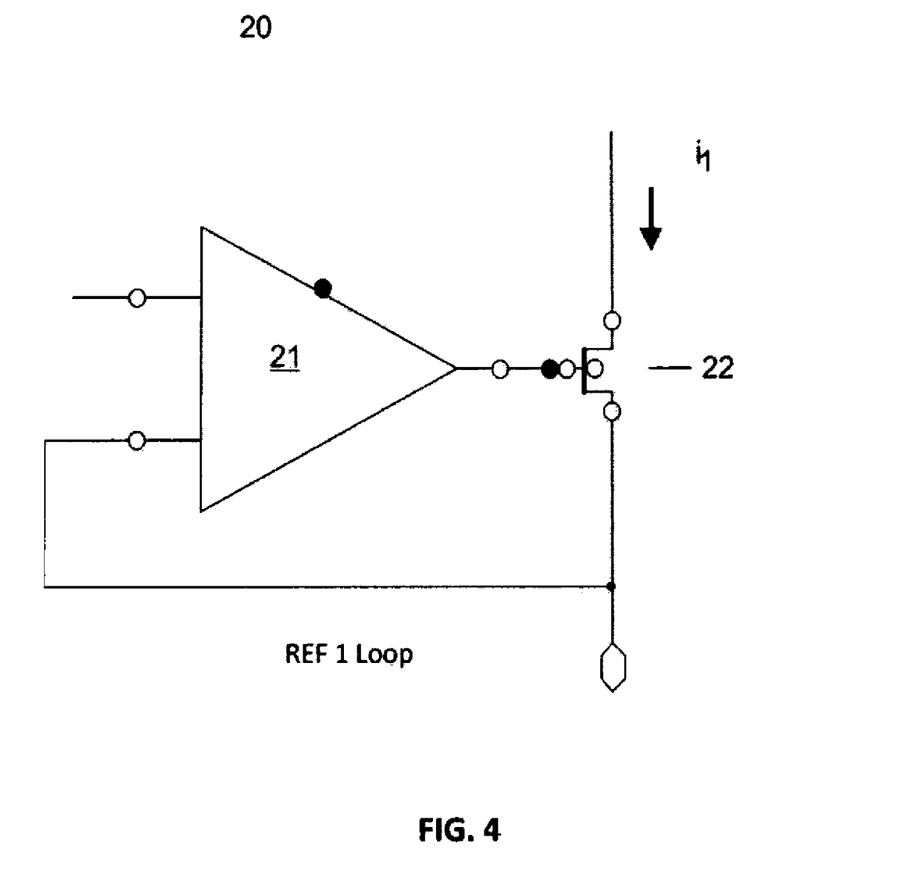
FIG. 4 is an exemplary circuit diagram showing a reference clamp loop used in the sensing circuit of FIG. 2

FIG. 4 depicts reference clamp loop 20. Reference clamp loop 20 comprises amplifier 21 and control transistor 22. Amplifier 21 and control transistor 22 ensure that the voltage on the BL/Drain of reference memory cell 120 remains sufficiently high such that memory cell 120 is always "on." Thus, current remains at a steady level whenever the reference clamp loop is turned on during every read cycle. The same design shown in FIG. 4 is used for reference clamp loop 30 and reference clamp loop 40 as well, except that the design of the memory cell and the control transistor will vary for each, such that reference cell 130 will draw current $i_2$ and reference cell 140 will draw current $i_3$, as explained previously.

Figure 5:
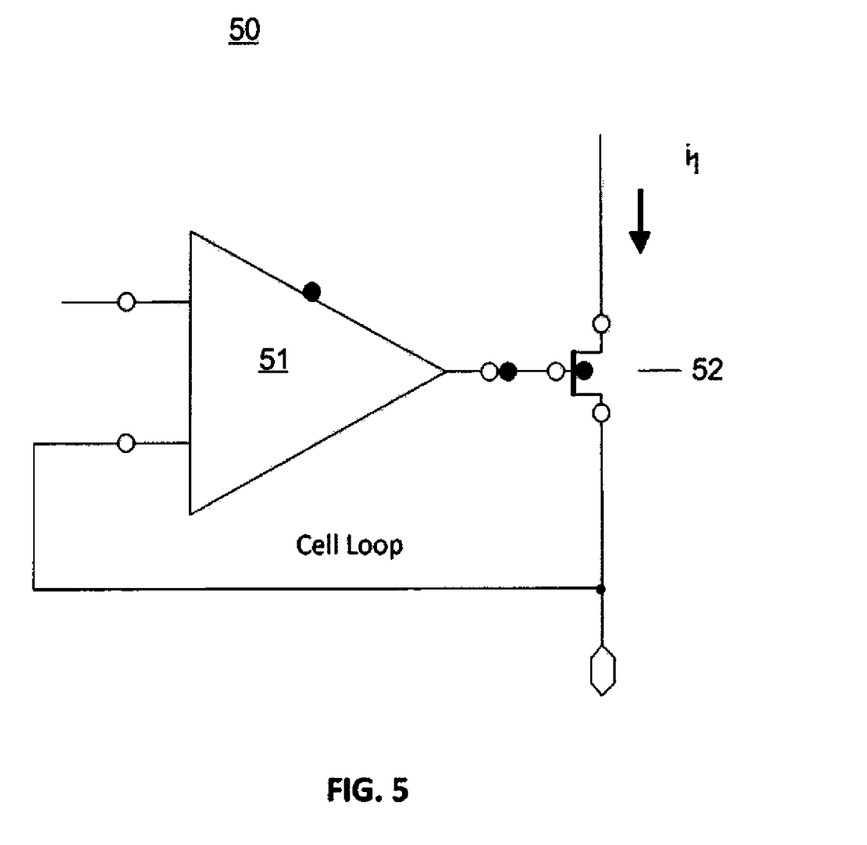
FIG. 5 is an exemplary circuit diagram showing a clamp loop used with the selected cell in the sensing circuit of FIG. 2.

FIG. 5 depicts selected cell loop 50. Selected cell loop 50 comprises amplifier 51 and control transistor 52. Memory cell 150 optionally can be a split gate cell. Amplifier 51 and control transistor 52 apply a voltage on the BL/Drain of memory cell 150. Memory cell 150 draws current $i_S$, which in one example can range from 0.0 mA (when memory cell 150 holds a "00" value) to 1.0 mA (when memory cell 150 holds a "11" value).

Figure 6:
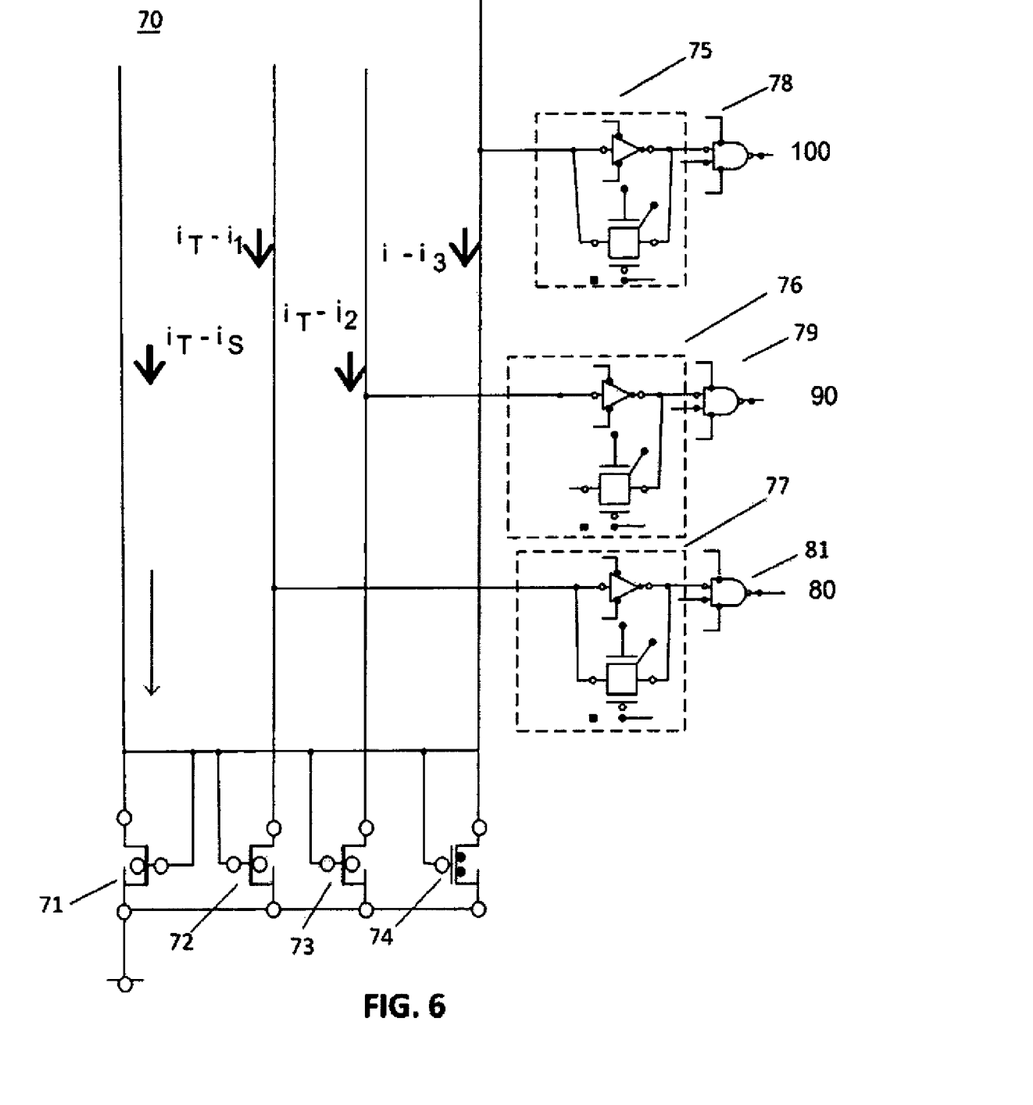
FIG. 6 is an exemplary circuit diagram showing a comparator used in the sensing circuit of FIG. 2.

FIG. 6 depicts comparator 70. Comparator 70 comprises NMOS transistors 71, 72, 73, and 74. The gate of each NMOS transistor 71, 72, 73, and 74 is connected to the line carrying current $i_T$-$i_S$ (which in turn is connected to selected cell loop 50), and the source of each NMOS transistor 71, 72, 73, and 74 is connected to ground. The drain of NMOS transistor 71 is connected to the line carrying current $i_T$-$i_S$, the drain of NMOS transistor 72 is connected to the line carrying current $i_T$-$i_1$, the drain of NMOS transistor 73 is connected to the line carrying current $i_T$-$i_2$, and the drain of NMOS transistor 74 is connected to the line carrying current $i_T$-$i_3$. NMOS transistors 71, 72, 73, and 74 each will be "on" only if two conditions are met. First, the voltage between the gate and source, often referred to as $v_{GS}$, must exceed $v_{TH}$, which is the threshold voltage for the NMOS transistor. For example, $v_{TH}$ might be 0.7V. If the voltage difference between the gate and source of any of NMOS transistors 71, 72, 73, or 74 is below $v_{TH}$, then the transistor will be "off" and will not draw any current from its source. Second, the voltage between the drain and source, often referred to as $v_{DS}$, must exceed the difference between the voltage between the gate and source and $v_{TH}$, that is, $v_{DS}$>($v_{GS}$-$v_{TH}$). If this condition is not met, then the transistor will be "off" even if the voltage on the gate exceeds $v_{TH}$.

With these parameters in mind, one will see that the voltage on the gate of each of transistors 71, 72, 73, and 74 will depend directly on current $i_T$-$i_S$. If current $i_T$-$i_S$ is 0.0 mA, then the voltage on each gate will be around 0.0 V. Similarly, the drain voltage for NMOS transistor 71 depends directly on current iT-iS, the drain voltage for NMOS transistor 72 depends directly on current iT-i1, the drain voltage for NMOS transistor 73 depends directly on current iT-i2, and the drain voltage for NMOS transistor 74 depends directly on current iT-i3.

Comparator 70 also comprises equalization block 75, equalization block 76, and equalization block 77. These equalization blocks 75, 76, and 77 each comprises an inverter in parallel with a pass gate, and the purpose of each equalization blocks 75, 76, and 77 is to improve sensing read speed. The equalization can be parallel ongoing with the pass gate "on" when reference loop and cell loop is set up. Once reference loop and cell loop set up ready, the pass gate should be "off" and the inverter would become a high speed amplifier and can fast amplify the input to these equalization blocks.

The input to equalization block 75 is the line carrying current iT-i3, and the output to equalization block 75 connects to the input of device 78, which is used for eliminating DC shunt current during equalization. The output of device 78 is output 100.

The input to equalization block 76 is the line carrying current iT-i2, and the output to equalization block 76 connects to the input of device 79, which is used for eliminating DC shunt current during equalization. The output of device 79 is output 90.

The input to equalization block 77 is the line carrying current iT-i1, and the output to equalization block 77 connects to the input of device 81, which is used for eliminating DC shunt current during equalization. The output of device 81 is output 80.

When NMOS transistor 72 is "off," all of the current iT-i1 will flow into the input mode of equalization block 77. If the voltage that emerges at the input to equalization block 77 is higher than a certain threshold voltage (the switch point of the inverter in the equalization block 77), the output of equalization block 77 will be a "0" and output 80 will be "1". When NMOS transistor 72 is "on," substantially all of the current iT-i1 will flow through NMOS transistor 72 to ground, and the voltage that emerges at the input to equalization block 77 will be relatively low, and the output of equalization block 77 will be a "1" and output 80 will be "0".

Similarly, when NMOS transistor 73 is "off," all of the current iT-i2 will flow into the input mode of equalization block 76. If the voltage that emerges at the input to equalization block 76 is higher than a certain threshold voltage (the switch point of the inverter in the equalization block 76), the output of equalization block 76 will be a "0" and output 90 will be "1". When NMOS transistor 73 is "on," substantially all of the current iT-i2 will flow through NMOS transistor 73 to ground, and the voltage that emerges at the input to equalization block 76 will be relatively low, and the output of equalization block 76 will be a "1" and output 90 will be "0".

Similarly, when NMOS transistor 74 is "off," all of the current iT-i3 will flow into the input mode of equalization block 75. If the voltage that emerges at the input to equalization block 75 is higher than a certain threshold voltage (the switch point of the inverter in the equalization block 75), the output of equalization block 75 will be a "0" and output 100 will be "1". When NMOS transistor 74 is "on," substantially all of the current iT-i3 will flow through NMOS transistor 74 to ground, and the voltage that emerges at the input to equalization block 75 will be relatively low, and the output of equalization block 75 will be a "1" and output 100 will be "0".

Figure 7:
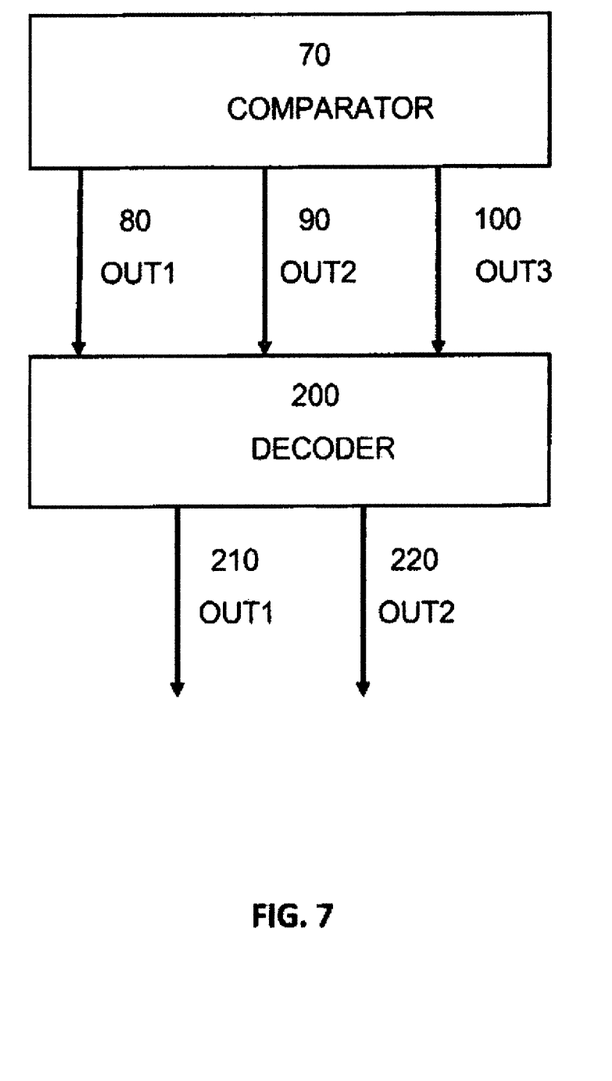
FIG. 7 is an exemplary block diagram of a comparator and decoder used with the sensing circuit of FIG. 1 or FIG. 2.

Thus, it can be appreciated that the transistors used in reference cells clamp loops 20, 30, and 40 and NMOS transistors 71, 72, 73, and 74 can be selected such that the desired properties discussed above with reference to Tables 1 and 2 can be achieved With reference to FIG. 7, outputs 80, 90, and 100 of comparator 70 optionally can connect to decoder 200. Decoders are known to those of skill in the art. Decoder 200 will convert outputs 80, 90, and 100 into a smaller set of data that more directly reflects the data stored in selected cell 50. Specifically, decoder 200 can be designed to exhibit the properties shown in Table 3:

TABLE 3

| Value stored in selected cell 50 | Output 80 | Output 90 | Output 100 | Output 210 | Output 220 |
|---|---|---|---|---|---|
| 00 | 0 | 0 | 0 | 0 | 0 |
| 01 | 1 | 0 | 0 | 0 | 1 |
| 10 | 1 | 1 | 0 | 1 | 0 |
| 11 | 1 | 1 | 1 | 1 | 1 |

The disclosed embodiments achieve high precision in sensing the state of selected memory cells without using current mirrors as in the prior art. This enables the sensing circuit to operate at lower operating voltages than in the prior art, such as at 1.0 V.

Figure 8:
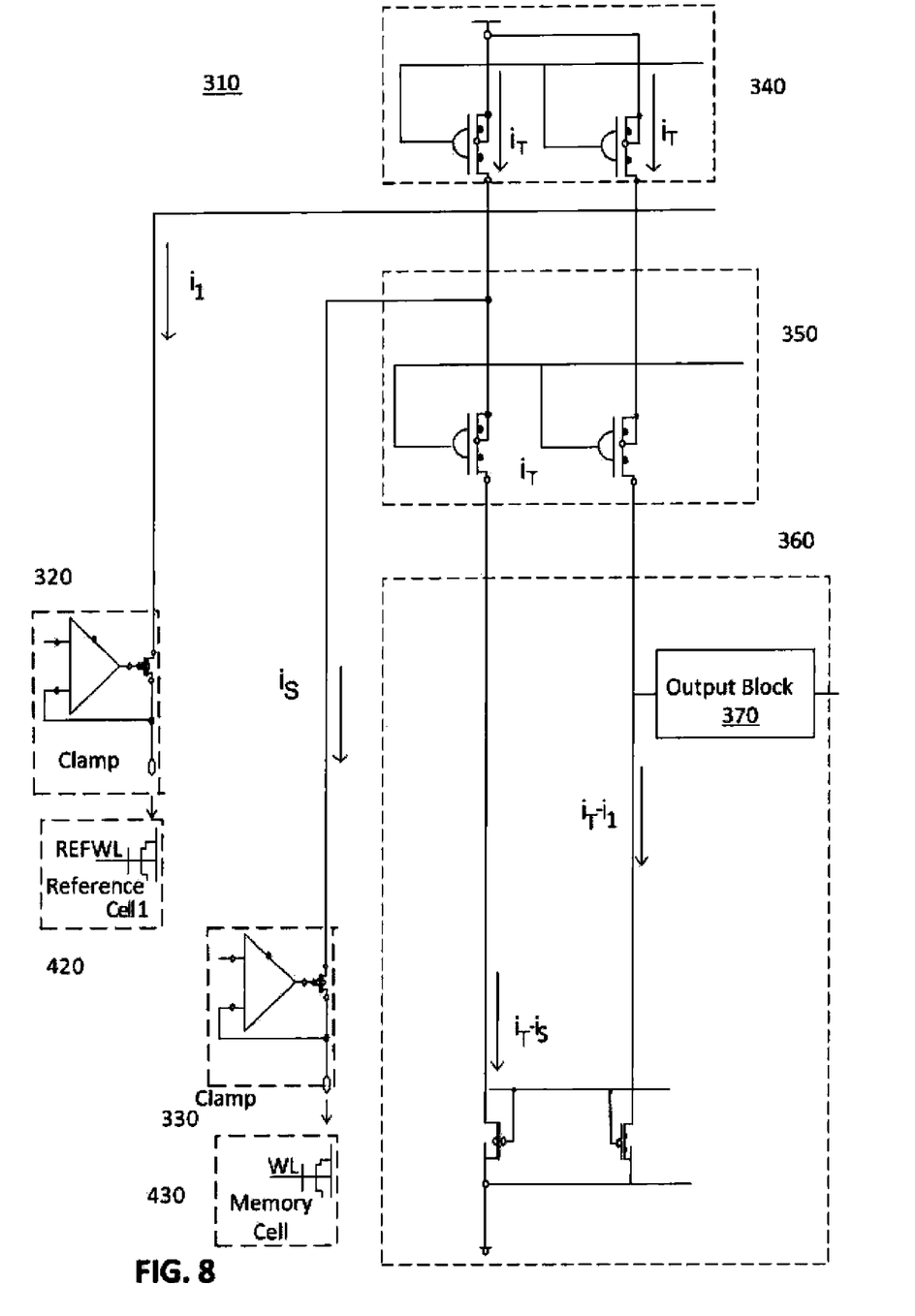
FIG. 8 is an exemplary circuit diagram of another sensing circuit embodiment that comprises a current injector.

Reference is now made to FIG. 8, which shows another embodiment. Sensing circuit 310 comprises current injector 340, reference clamp loop 320, reference cell 420, clamp loop 330, selected cell 430, comparator 360, and circuit 350. In this embodiment, only one reference clamp loop and reference cell is used because selected cell 430 is capable of holding only one of two different states. Thus, only one comparison is made, and on the basis of that comparison, it is determined whether selected cell 430 is storing a "0" or a "1."

The operation of sensing circuit 310 is similar to the operation of sensing circuit 10, described previously with respect to FIGS. 1-7. Specifically, current injector 340 has the same design as current injector 60 (shown in FIGS. 1-3) except that current injector 340 produces only two instances o the current $i_T$. Reference clamp loop 320 has the same design as reference clamp loop 20 (shown in FIGS. 1, 2, and 4), and reference cell 420 has the same design as reference cell 130 (shown in FIGS. 1-2), except that the value of its current in the "on" state may differ. Clamp loop 330 has the same design as clamp loop 50 (shown in FIGS. 1, 2, and 5), and selected cell 430 has the same design as selected cell 150 (shown in FIGS. 1, 2, and 5). Circuit 350 has the same design as circuit 110, except that it contains only two conductive paths instead of four. Comparator 360 has the same design as comparator 70, except that only two values are compared, with the result appearing as the output of output block 370.

Reference is now made to FIG. 2, which shows sensing circuit 10 in greater detail. Shown in FIG. 2 is current injector 60, reference clamp loop 20, reference cell 120, reference clamp loop 30, reference cell 130, reference clamp loop 40, reference cell 140, clamp loop 50, selected cell 150, and comparator 70, as described previously with reference to FIG. 1. FIG. 2 also shows circuit 110, which can be used to generate the drain voltage of each PMOS transistor within current injector 60, where the drain voltage of each PMOS transistor will be the voltage of the gate plus $V_{TH}$ of the PMOS transistor of circuit 110. The drain voltage of each PMOS transistor within current injector 60 should be the same, such that any channel modulation effect can be minimized. Each of these items will be discussed in greater detail with reference to FIGS. 3-5, which each contain an enlarged portion of FIG. 2.

References to the present invention herein are not intended to limit the scope of any claim or claim term, but instead merely make reference to one or more features that may be covered by one or more of the claims. Materials, processes and numerical examples described above are exemplary only, and should not be deemed to limit the claims. It should be noted that, as used herein, the terms "over" and "on" both inclusively include "directly on" (no intermediate materials, elements or space disposed there between) and "indirectly on" (intermediate materials, elements or space disposed there between). Likewise, the term "adjacent" includes "directly adjacent" (no intermediate materials, elements or space disposed there between) and "indirectly adjacent" (intermediate materials, elements or space disposed there between). For example, forming an element "over a substrate" can include forming the element directly on the substrate with no intermediate materials/elements there between, as well as forming the element indirectly on the substrate with one or more intermediate materials/elements there between.

What is claimed is:

1. An apparatus for use in a memory device, comprising:
   a current injector having a plurality of injection outputs;
   a plurality of clamps, each clamp connected to one of the plurality of injection outputs;
   one or more reference cells, wherein each reference cell is connected to a different one of the plurality of clamps;
   a selected memory cell connected to one of the plurality of clamps different from the clamps to which the one or more reference cells are connected; and
   a comparator connected to the plurality of injection outputs, wherein the comparator comprises one or more comparator outputs that indicate the value stored in the selected memory cell.

2. The apparatus of claim 1, wherein the selected memory cell is a split gate non-volatile memory cell.

3. The apparatus of claim 2, wherein the selected memory cell can store one of two different values.

4. The apparatus of claim 2, wherein the selected memory cell can store one of four different values.

5. The apparatus of claim 4, wherein the one or more reference cells comprise three reference cells.

6. The apparatus of claim 5, wherein the current injector comprises four PMOS transistors.

7. The apparatus of claim 6, wherein the four PMOS transistors are identical.

8. The apparatus of claim 1, wherein the comparator compares the current emitted by one injection output minus the current drawn by a reference cell against the current emitted by another injection output minus the current drawn by the selected memory cell.

9. An apparatus for use in reading a memory cell, comprising:
   a current injector having a plurality of injection outputs;
   a plurality of clamps, each clamp connected to one of the plurality of injection outputs;
   one or more reference cells, wherein each reference cell is connected to a different one of the plurality of clamps;
   a selected memory cell connected to one of the plurality of clamps different from the clamps to which the one or more reference cells are connected;
   a comparator connected to the plurality of injection outputs; and
   a decoder connected to one or more outputs of the comparator, wherein the decoder comprises one or more decoder outputs that indicate the value stored in the selected memory cell.

10. The apparatus of claim 9, wherein the selected memory cell is a split gate non-volatile memory cell.

11. The apparatus of claim 10, wherein the selected memory cell can store one of two different values.

12. The apparatus of claim 10, wherein the selected memory cell can store one of four different values.

13. The apparatus of claim 12, wherein the one or more reference cells comprise three reference cells.

14. The apparatus of claim 13, wherein the current injector comprises four PMOS transistors.

15. The apparatus of claim 14, wherein the four PMOS transistors are identical.

16. The apparatus of claim 9, wherein the comparator compares the current emitted by one injection output minus the current drawn by a reference cell against the current emitted by another injection output minus the current drawn by the selected memory cell.

17. A method of reading a memory cell, comprising:
   generating, by a current injector, a plurality of injection outputs;
   drawing current from one or more injection outputs by one or more reference cells, wherein each reference cell is connected to a different one of the plurality of injection outputs through a clamp;

drawing current by a selected memory cell from an injection output different from the injection outputs to which the one or more reference cells are connected through a clamp;

comparing, by a comparator connected to the plurality of injection outputs, two or more currents; and generating, by the comparator, one or more comparator outputs that indicate the value stored in the selected memory cell.

18. The method of claim 17, wherein the selected memory cell is a split gate non-volatile memory cell.

19. The method of claim 18, wherein the selected memory cell can store one of two different values.

20. The method of claim 18, wherein the selected memory cell can store one of four different values.

21. The method of claim 20, wherein the one or more reference cells comprise three reference cells.

22. The method of claim 21, wherein the current injector comprises four PMOS transistors.

23. The method of claim 22, wherein the four PMOS transistors are identical.

24. The method of claim 17, wherein said current injector generates a plurality of substantially constant currents as injection outputs.

25. The method of claim 24, wherein each of said one or more reference cells draws a different amount of current than the other reference cells.

26. The method of claim 17, wherein the two or more currents comprises:

the current emitted by one injection output minus the current drawn by a reference cell; and the current emitted by another injection output minus the current drawn by the selected memory cell.

* * * * *